(12) United States Patent
Iwamoto et al.

(10) Patent No.: US 6,700,141 B2
(45) Date of Patent: Mar. 2, 2004

(54) SEMICONDUCTOR DEVICE

(75) Inventors: Susumu Iwamoto, Nagano (JP); Tatsuhiko Fujihira, Nagano (JP); Katsunori Ueno, Nagano (JP); Yasuhiko Onishi, Nagano (JP); Takahiro Sato, Nagano (JP)

(73) Assignee: Fuji Electric Co., Ltd. (JP)

( * ) Notice: Subject to any disclaimer, the term of this patent is extended or adjusted under 35 U.S.C. 154(b) by 141 days.

(21) Appl. No.: 09/978,847

(22) Filed: Oct. 17, 2001

(65) Prior Publication Data
US 2002/0088990 A1 Jul. 11, 2002

(30) Foreign Application Priority Data
Oct. 20, 2000 (JP) ........................ 2000-320875

(51) Int. Cl.$^7$ .................... H01L 29/36; H01L 29/417
(52) U.S. Cl. ....................... 257/110; 257/120
(58) Field of Search ................. 257/110, 341, 257/363, 120, 129, 136

(56) References Cited

U.S. PATENT DOCUMENTS 5,216,275 A  6/1993  Chen ................... 257/493
5,438,215 A  8/1995  Tihanyi ................ 257/401
6,066,878 A  5/2000  Neilson ............... 257/342
6,081,009 A  * 6/2000  Neilson ............... 257/341

FOREIGN PATENT DOCUMENTS

JP  2000-40822  2/2000

* cited by examiner

*Primary Examiner*—Amir Zarabian
*Assistant Examiner*—Kiesha Rose
(74) *Attorney, Agent, or Firm*—Rossi & Associates

(57) ABSTRACT

A reliable super-junction semiconductor device is provided that facilitates relaxing the tradeoff relation between the on-resistance and the breakdown voltage and improving the avalanche withstanding capability under an inductive load. The super-junction semiconductor device includes an active region including a thin first alternating conductivity type layer and a heavily doped $n^+$-type intermediate drain layer between first alternating conductivity type layer and an $n^{++}$-type drain layer, and a breakdown withstanding region including a thick second alternating conductivity type layer. Alternatively, active region includes a first alternating conductivity type layer and a third alternating conductivity type layer between first alternating conductivity type layer and $n^{++}$-type drain layer, third alternating conductivity type layer being doped more heavily than first alternating conductivity type layer.

35 Claims, 8 Drawing Sheets

SEMICONDUCTOR DEVICE

BACKGROUND OF THE INVENTION

I. Field of the Invention

The present invention relates to a semiconductor structure applicable to semiconductor devices, such as MOSFET's (insulated gate field effect transistors), IGBT's (insulated gate bipolar transistors), bipolar transistors and diodes. Specifically, the present invention relates to a semiconductor structure, that provides a current path in the ON-state of the device and is depleted in the OFF-state of the device to realize a high breakdown voltage and a high current capacity.

II. Description of Related Art

The semiconductor devices may be classified into a lateral device, which has main electrodes thereof arranged on one major surface with a drift current flow parallel to the major surface, and a vertical device, which has the main electrodes thereof distributed on two major surfaces facing opposite to each other and a drift current flow perpendicular to the major surfaces. In the vertical semiconductor device, the drift current flows in the thickness direction of the semiconductor chip (vertically) in the ON-state of the semiconductor device and depletion layers expand also in the thickness direction of the semiconductor chip (vertically) in the OFF-state of the semiconductor device. In the conventional vertical planar-type n-channel MOSFET, the very resistive n-type drift layer thereof provides a drift current path in the ON-state of the MOSFET and is depleted in the OFF-state thereof, resulting in a high breakdown voltage.

Thinning the n-type drift layer, that is shortening the drift current path, facilitates a substantial reduction in the on-resistance, since the drift resistance against the drift current flow is reduced. However, thinning the n-type drift layer narrows the separation width between the drain and the base, limiting the expansion of the depletion layers of the pn-junctions between p-type base regions and the n-type drift layer. Due to the narrow expansion width of the depletion layers, the electric field strength soon reaches the critical value for silicon. Therefore, breakdown is caused at a voltage lower than the designed breakdown voltage of the device. A high breakdown voltage is obtained by increasing the thickness of the n-type drift layer. However, the thick n-type drift layer inevitably causes high on-resistance that further causes loss increase. In other words, there exists a tradeoff relation between the on-resistance and the breakdown voltage.

The tradeoff relation between the on-resistance and the breakdown voltage exists in the other semiconductor devices such as IGBT's, bipolar transistors and diodes. The tradeoff relation also exists in the lateral semiconductor devices, in that the flow direction of the drift current in the ON-state of the device and the expansion direction of the depletion layers by applying a reverse bias voltage in the OFF-state of the device are different from each other. European Patent 0 053 854, U.S. Pat. Nos. 5,216,275, 5,438,215, and Japanese Unexamined Laid Open Patent Application H09-266311 disclose semiconductor devices, which facilitate reducing the tradeoff relation between the on-resistance and the breakdown voltage. The drift layers of the disclosed semiconductor devices are formed of alternating conductivity type layers including heavily doped n-type regions and heavily doped p-type regions. The alternating conductivity type layer, depleted in the OFF-state, facilitates sustaining a high breakdown voltage.

The drift layer of the every disclosed semiconductor device is not a uniform impurity diffusion layer of one conductivity type but an alternating conductivity type layer formed of thin n-type drift regions and thin p-type partition regions laminated alternately. The n-type drift regions and p-type partition regions are shaped with respective thin layers extending vertically. Since the entire drift layer is occupied by the depletion layers expanding laterally from the vertically extending pn-junctions between n-type drift regions and p-type partition regions in the OFF-state of the MOSFET, a high breakdown voltage is obtained even when the impurity concentrations in the n-type drift regions and the p-type partition regions are high.

Japanese Unexamined Laid Open Patent Application No. 2000-40822 discloses the method of manufacturing such a semiconductor device including an alternating conductivity type layer. FIG. 8 is a cross sectional view of the vertical MOSFET disclosed in U.S. Pat. No. 5,216,275. Referring now to FIG. 8, the vertical MOSFET includes a drift layer 12, that is not a uniform layer but is formed of n-type drift regions 12a and p-type partition regions 12b arranged alternately. In the figure, p-type well regions 13, $n^+$-type source regions 14, gate insulation films 15, gate electrode layers 16, a source electrode 17 and a drain electrode 18 are shown.

The alternating-conductivity-type drift layer 12 is formed by the epitaxially growing a very resistive n-type layer on an $n^{++}$-type drain layer 11 used for a substrate, by selectively etching trenches in the n-type layer, leaving n-type drift regions 12a, and by epitaxially growing p-type partition regions 12b in the trenches. Hereinafter, the semiconductor device including an alternating conductivity type layer, that provides a current path in the ON-state of the device and is depleted in the OFF-state of the device, will be referred to as the "super-junction semiconductor device".

The foregoing publications describe active regions including an alternating conductivity type layer, through which a drift current flows. However, the foregoing publications describe almost nothing on the breakdown withstanding region, usually disposed around the active region to realize a high breakdown voltage. For realizing a practical semiconductor device exhibiting a high breakdown voltage, it is necessary to design the semiconductor structure based on the consideration of the breakdown voltage.

For example, when the thickness of the alternating conductivity type layer in the active region and the thickness thereof in the breakdown withstanding region are the same, a voltage is applied evenly to the n-type drift regions and the p-type partition regions of the alternating conductivity type layer. As a result, depletion layers expand vertically, and the electric field in the active region is relaxed in proportion to the thickness of the alternating conductivity type layer. In the breakdown withstanding region, the surface electric field parallel to the major surface is relaxed by employing a field plate structure or a guard ring structure. However, depletion layers do not expand so widely in the breakdown withstanding region as compared with in the active region. Therefore, the electric field in the breakdown withstanding region is denser than the electric field in the active region. Therefore, the electric field strength in the breakdown withstanding region reaches the critical value sooner than the electric field strength in the active region. As a result, the breakdown withstanding region determines the breakdown voltage of the semiconductor device.

Since the electric field strength in the breakdown withstanding region reaches the critical value sooner than the electric field strength in the active region, an avalanche current is caused in the breakdown withstanding region. The avalanche current, that localizes to the outer p-type region in the active region, makes a parasitic transistor work. Thus, breakdown is caused in the super-junction semiconductor device and the reliability of the super-junction semiconductor device is impaired, Moreover, it is difficult to maintain an avalanche withstanding capability (breakdown withstanding capability) of the super-junction semiconductor device under an inductive load (hereinafter referred to as an "L-load").

In view of the foregoing, it would be desirable to provide a very reliable super-junction semiconductor device, that facilitates relaxing tradeoff relation between the on-resistance and the breakdown voltage and improving the avalanche withstanding capability under an L-load.

SUMMARY OF THE INVENTION

According to a first aspect of the invention, there is provided a semiconductor device including: a semiconductor chip having a first major surface and a second major surface facing opposite to the first major surface; a first main electrode on the first major surface; a second main electrode on the second major surface; a layer with low electrical resistance on the side of the second major surface; a first alternating conductivity type layer formed of first semiconductor regions of a first conductivity type and second semiconductor regions of a second conductivity type arranged alternately at a first pitch of repeating; a second alternating conductivity type layer formed of third semiconductor regions of the first conductivity type and fourth semiconductor regions of the second conductivity type arranged alternately at a second pitch of repeating; the first alternating conductivity type layer and the second alternating conductivity type layer being between the first major surface and the layer with low electrical resistance; and the thickness of the first alternating conductivity type layer and the thickness of the second alternating conductivity type layer being different from each other.

Advantageously, the second alternating conductivity type layer is thicker than the first alternating conductivity type layer, and the second alternating conductivity type layer is around the first alternating conductivity type layer. When the second alternating conductivity type layer in the breakdown withstanding region is thicker than the first alternating conductivity type layer in the active region, the electric field strength in the breakdown withstanding region is relaxed more than the electric field strength in the active region and, therefore, the electric field strength in the active region reaches the critical value in advance of the electric field strength in the breakdown withstanding region. Therefore, the breakdown voltage of the device is determined by the structure of the active region. Since an avalanche current is caused not in the breakdown withstanding region but in the active region, the avalanche current does not localize to the peripheral portion of the active region. Therefore, the reliability and the avalanche withstanding capability under an L-load of the super-junction semiconductor device are improved. Since the first alternating conductivity type layer in the active region according to the invention is thinner than the conventional alternating conductivity type layers, the drift current path length is shortened and, therefore, the on-resistance is reduced.

According to a second aspect of the invention, there is provided a semiconductor device including a very resistive region, the specific resistance thereof is high, of the first conductivity type or the second conductivity type around the first alternating conductivity type layer or around the second alternating conductivity type layer, the very resistive region being thicker than the first alternating conductivity type layer.

According to a third aspect of the invention, there is provided a semiconductor device including a third alternating conductivity type layer between the first alternating conductivity type layer and the layer with low electrical resistance, the third alternating conductivity type layer being formed of fifth semiconductor regions of the first conductivity type and sixth semiconductor regions of the second conductivity type arranged alternately at the first pitch of repeating, the impurity concentrations in the fifth semiconductor regions and the sixth semiconductor regions and the impurity concentrations in the first and second semiconductor regions being different from each other.

Advantageously, the impurity concentrations in the fifth semiconductor regions and the sixth semiconductor regions are higher than the impurity concentrations in the first semiconductor regions and the second semiconductor regions. Advantageously, the impurity concentration in the fifth semiconductor regions or the impurity concentration in the sixth semiconductor regions is higher than the impurity concentration in the first semiconductor regions or the second semiconductor regions. Since in certain semiconductor regions, the impurity concentration thereof are high, of the third alternating conductivity type layer in the active region suppress depletion layer expansion, the electric field strength is raised and the electric field strength in the active region reaches the critical value in advance of the electric field strength in the breakdown withstanding region.

Advantageously, the second pitch of repeating is narrower than the first pitch of repeating. Advantageously, the impurity concentrations in the second alternating conductivity type layer are lower than the impurity concentrations in the first alternating conductivity type layer or the impurity concentrations in the third alternating conductivity type layer. Since the structures described above facilitate relaxing the electric field in the breakdown withstanding region more easily than the electric field in the active region, the electric field strength in the active region reaches the critical value in advance of the electric field strength in the breakdown withstanding region and an avalanche current flows in the active region in advance.

Advantageously, the semiconductor device further includes a heavily doped intermediate semiconductor layer of the first conductivity type between the first alternating conductivity type layer and the layer with low electrical resistance. The heavily doped intermediate semiconductor layer of the first conductivity type facilitates suppressing depletion layer expansion therein and raising the electric field strength in the active region. Advantageously, the impurity concentration in the intermediate semiconductor layer is higher than the impurity concentration in the first semiconductor regions in the first alternating conductivity type layer. This impurity concentration profile facilitates suppressing depletion layer expansion in the intermediate semiconductor layer more effectively.

The very resistive region around the first alternating conductivity type layer or around the second alternating conductivity type layer, which can be of either the first conductivity type or the second conductivity type, promotes depletion layer expansion in the very resistive region and reduces the electric field strength in the breakdown withstanding region. Advantageously, the impurity concentration $N_D$ in the very resistive region and the breakdown voltage $V_{DSS}$ (V) of the semiconductor device are related to each other by the following expression.

$$N_D \leq 5.62 \times 10^{17} \times V_{DSS}^{-1.36} (\text{cm}^{-3})$$

German Patent Application DE 19 954 351A1 discloses that it is effective to control the specific resistance of the breakdown withstanding region by adjusting the impurity concentration as expressed by the above expression. The above expression is effectively applicable also to the semiconductor device including a heavily doped intermediate layer of the first conductivity type or a heavily doped third alternating conductivity type layer interposed between the first alternating conductivity type layer and the layer with low electrical resistance.

Advantageously, the semiconductor device further includes a channel stopper region of either first conductivity type or the second conductivity type around the very resistive region. The channel stopper region disposed around the very resistive region stabilizes the breakdown voltage and improves the reliability of the device.

BRIEF DESCRIPTION OF THE DRAWINGS

Brief description of the drawings illustrating the preferred embodiments of the invention are shown below, in which.

DETAILED DESCRIPTION OF THE DRAWINGS

The invention will now be explained hereinafter with reference to the accompanied drawing figures which illustrate the preferred embodiments of the invention. In the following descriptions, the n-type layer or the n-type region is a layer or a region, in which electrons are majority carriers. The p-type layer or the p-type region is a layer or a region, in which holes are majority carriers. The suffix "+" on the right shoulder of the letter "n" or "p" indicating the conductivity type of the layer or the region indicates that the region or the layer is doped relatively heavily. The suffix "−" on the right shoulder of the letter "n" or "p" indicating the conductivity type of the layer or the region indicates that the region or the layer is doped relatively lightly.

First Embodiment

Figure 1:
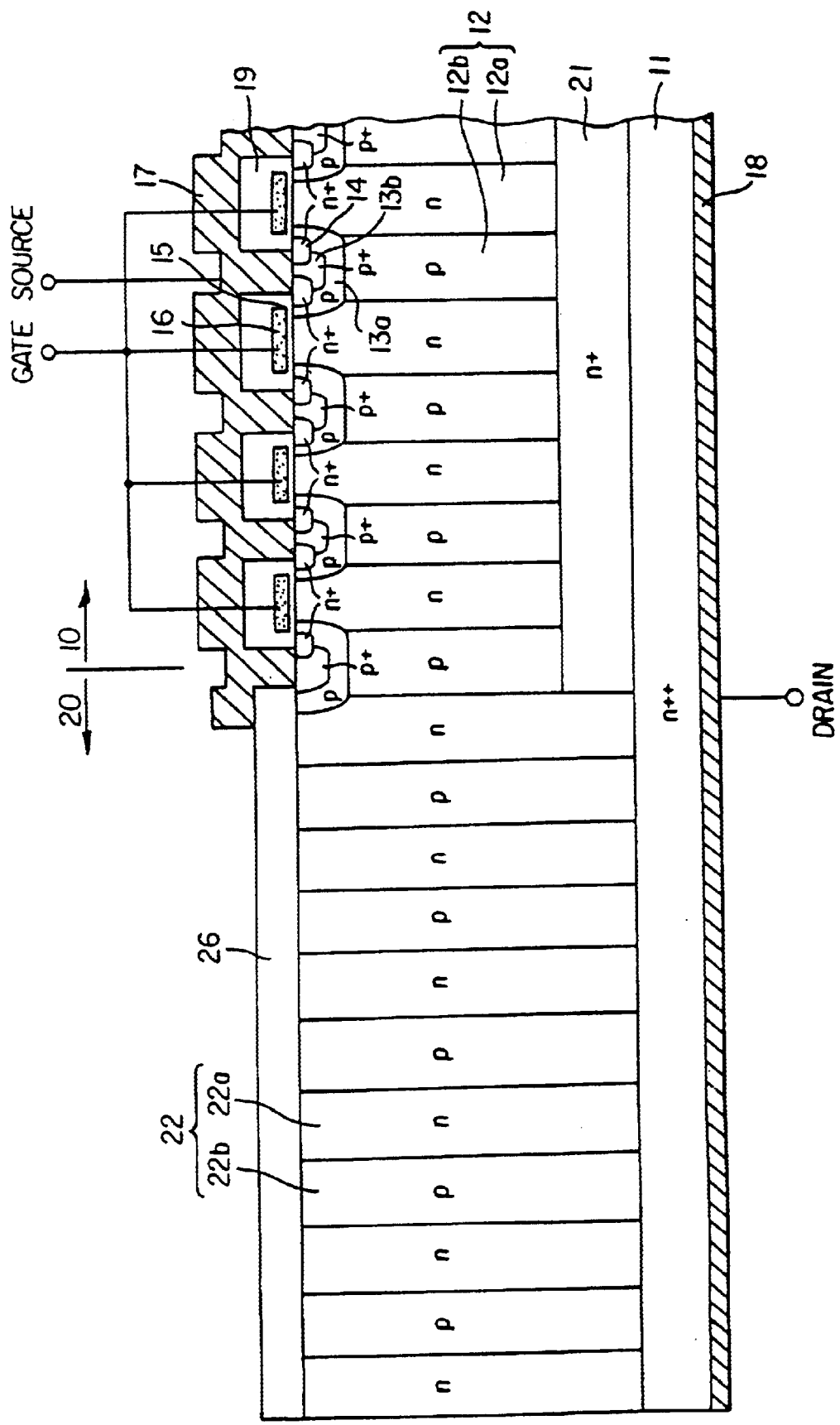
FIG. 1 is a cross sectional view, illustrating the peripheral portion of a vertical super-junction MOSFET according to a first embodiment of the invention.

FIG. 1 is a cross sectional view showing the peripheral portion of a vertical super-junction MOSFET according to a first embodiment of the invention. The edge portion of an n-channel MOSFET according to the first embodiment of the invention is shown on the left hand side of the figure. Referring now to FIG. 1, the super-junction MOSFET according to the first embodiment includes an $n^{++}$-type drain layer 11 with low electrical resistance and a first alternating conductivity type layer 12 formed of thin n-type first semiconductor regions (n-type drift regions) 12a and thin p-type second semiconductor regions (p-type partition regions) 12b arranged alternately and in parallel to each other and perpendicular to the $n^{++}$-type drain layer 11. The super-junction MOSFET further includes p-type well regions 13a in contact with p-type partition regions 12b. The super-junction MOSFET further includes an $n^+$-type source region 14 and a heavily doped $p^+$-type contact region 13b in each p-type well region 13a. A polycrystalline silicon gate electrode layer 16 is above the extended portion of p-type well region 13a extended between $n^+$-type source region 14 and n-type drift region 12a with a gate insulation film 15 interposed therebetween. A source electrode 17 contacts commonly with $n^+$-type source regions 14 and $p^+$-type contact regions 13b. A drain electrode 18 is on the back surface of $n^{++}$-type drain layer 11. In FIG. 1, interlayer insulation films 19 for surface stabilization and for surface protection are also shown. For example, interlayer insulation film 19 is a thermally oxidized film or a film of phosphate silicate glass (PSG). In many devices, source electrode 17 is extended over gate electrode layers 16 with interlayer insulation films 19 interposed therebetween. Although not shown in the figure, a metal gate electrode is connected to gate electrode layers 16. The constituent elements described above constitute an active region 10 of the vertical MOSFET according to the first embodiment. The vertical MOSFET according to the first embodiment includes a breakdown withstanding region 20 including a second alternating conductivity type layer 22 around first alternating conductivity type layer 12. The second alternating conductivity type layer 22 includes n-type third semiconductor regions (n-type drift regions) 22a and p-type fourth semiconductor regions (p-type partition regions) 22b. In FIG. 1, an insulation film 26 for surface protection and for surface stabilization is also shown.

The specific feature of the vertical MOSFET according to the first embodiment is an $n^+$-type intermediate drain layer 21 beneath alternating conductivity type layer 12 in the active region of the semiconductor device. The $n^+$-type intermediate drain layer 21 is doped more heavily than the n-type drift region 12a. First alternating conductivity type layer 12 in active region 10 is thinner than second alternating conductivity type layer 22 in breakdown withstanding region 20 by the thickness of $n^+$-type intermediate drain layer 21. The widths of n-type drift region 12a, p-type partition region 12b, n-type drift region 22a and p-type partition region 22b are the same, and the impurity concentrations in n-type drift region 12a, p-type partition region 12b, n-type drift region 22a and p-type partition region 22b are the same.

In a horizontal cross section, n-type drift regions 12a and p-type partition regions 12b are shaped with respective stripes. Alternatively, n-type drift regions 12a or p-type partition regions 12b may be arranged in a horizontal lattice pattern or in a horizontal net pattern, and p-type partition regions 12b or n-type drift regions 12a may be located between n-type drift regions 12a or p-type partition regions 12b, respectively. Various horizontal arrangements of n-type drift regions 12a and p-type partition regions 12b are employable. The dimensions, the impurity concentrations and such typical parameters of the constituent layers and regions for the MOSFET of the 700 V class are as follows. The specific resistance of $n^{++}$-type drain layer 11 is 0.01 Ωcm. The $n^{++}$-type drain layer 11 is 350 μm in thickness. First alternating conductivity type layer 12 in active region 10 is 40 μm in thickness. The widths of n-type drift region 12a and p-type partition region 12b are the same 8.0 μm. In other words, the spacing between the centers of n-type drift region 12a and p-type partition region 12b, that is the first pitch of repeating, is 16 μm. The average impurity concentrations in n-type drift region 12a and p-type partition region 12b are the same $2 \times 10^{15}$ cm$^{-3}$. The diffusion depth of p-type well regions 13a is 1 μm. The surface impurity concentration of p-type well regions 13a is $3 \times 10^{18}$ cm$^{-3}$. The diffusion depth of $n^+$-type source regions 14 is 0.3 μm. The surface impurity concentration of $n^+$-type source regions 14 is $1 \times 10^{20}$ cm$^{-3}$. The $n^+$-type intermediate drain layer 21 is 10 μm in thickness. The impurity concentration in $n^+$-type intermediate drain layer 21 is preferably between $1 \times 10^{14}$ cm$^{-3}$ and $1 \times 10^{20}$ cm$^{-3}$. Second alternating conductivity type layer 22 in breakdown withstanding region 20 is 50 μm in thickness. The widths of the constituent regions in second alternating conductivity type layer 22 are the same with the widths of the constituent regions in first alternating conductivity type layer 12.

First alternating conductivity type layer 12 in active region 10 and second alternating conductivity type layer 22 in breakdown withstanding region 20 are formed, for example, by epitaxial growth. Alternatively, the alternating conductivity type layers are formed by repeating several times a step of forming buried regions, therein impurity atoms are buried locally, and a step of epitaxially growing an $n^-$-type very resistive layer and by thermally driving the impurity atoms.

As described earlier, the alternating conductivity type layer in the active region is completely depleted at an applied voltage of around 50 V and, then, the voltage is applied in the depth direction when the thickness of the alternating conductivity type layer in the active region and the thickness of the alternating conductivity type layer in the breakdown withstanding region are the same. In the breakdown withstanding region, depletion layers do not expand so widely as in the active region. Therefore, the electric field in the breakdown withstanding region is denser than the electric field in the active region, and the electric field strength in the breakdown withstanding region reaches the critical value in advance of the electric field strength in the active region. As a result, the breakdown voltage is determined by the breakdown withstanding region.

When first alternating conductivity type layer 12 in active region 10 is thinner than second alternating conductivity type layer 22 in breakdown withstanding region 20, the electric field is denser in active region 10 than in breakdown withstanding region 20. Therefore, the electric field strength in active region 10 reaches the critical value in advance of the electric field strength in breakdown withstanding region 20. Therefore, the breakdown voltage is determined by active region 10, and the avalanche withstanding capability is improved. Thus, the reliability of the super-junction semiconductor device is improved.

Since the MOSFET according to the first embodiment operates in the similar manner as the MOSFET disclosed in Japanese Unexamined Laid Open Patent Application 2000-40822, the descriptions on the fundamental operations of the MOSFET according to the first embodiment will be omitted.

In the MOSFET according to the first embodiment, n-type drift regions 12a are doped heavily and the thickness of first alternating conductivity type layer 12 is reduced correspondingly to the increased impurity concentration in n-type drift regions 12a. The on-resistance of the MOSFET according to the first embodiment is about one tenth as high as the on-resistance of the conventional MOSFET including an n-type drift layer. The MOSFET according to the first embodiment still facilitates obtaining a sufficiently high breakdown voltage. Furthermore, by reducing the width of n-type drift regions 12a and by increasing the impurity concentration therein, the on-resistance is further reduced and the tradeoff relation between the on-resistance and the breakdown voltage is relaxed.

Alternatively, the second pitch of repeating, with which a pair of n-type drift region 22a and p-type partition region 22b is repeated in second alternating conductivity type layer 22, may be shorter than the first pitch of repeating, with which a pair of n-type drift region 12a and p-type partition region 12b is repeated in first alternating conductivity type layer 12. Since this alternative structure facilitates generating more depletion layers per a unit length in breakdown withstanding region 20 than in active region 10, the electric field is relaxed more in breakdown withstanding region 20 than in active region 10. Therefore, the breakdown voltage is determined more easily by the alternative structure than by the basic structure shown in FIG. 1.

Alternatively, the impurity concentrations in second alternating conductivity type layer 22 may be lower than the impurity concentrations in first alternating conductivity type layer 12. Since this alternative impurity distribution profile facilitates generating depletion layers per a unit length more easily in breakdown withstanding region 20 than in active region 10, the electric field is relaxed more in breakdown withstanding region 20 than in active region 10.

Alternatively, the boundaries between n-type drift regions 22a and p-type partition regions 22b may be extended in perpendicular to the boundaries between n-type drift regions 12a and p-type partition regions 12b. In this alternative structure, the second pitch of repeating, with which a pair of n-type drift region 22a and p-type partition region 22b is repeated in second alternating conductivity type layer 22, may be shorter than the first pitch of repeating, with which a pair of n-type drift region 12a and p-type partition region 12b is repeated in first alternating conductivity type layer 12 or, the impurity concentrations in second alternating conductivity type layer 22 may be lower than the impurity concentrations in first alternating conductivity type layer 12. These modifications are also effective to relax the electric field more in breakdown withstanding region 20 than in active region 10.

Second Embodiment

Figure 2:
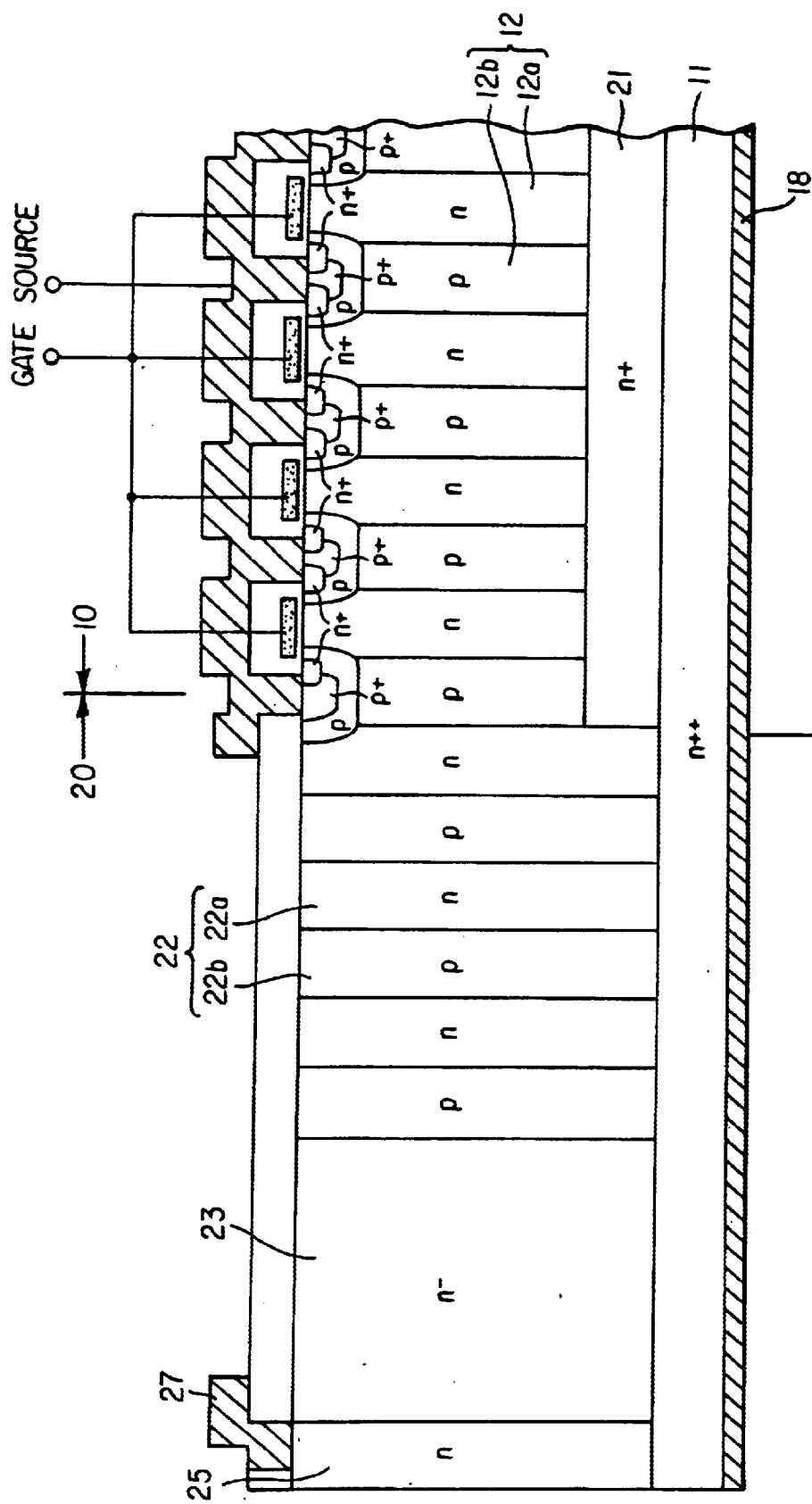
FIG. 2 is a cross sectional view, illustrating the peripheral portion of a vertical super-junction MOSFET according to a second embodiment of the invention.

FIG. 2 is a cross sectional view showing the peripheral portion of a vertical super-junction MOSFET according to a second embodiment of the invention. The edge portion of the n-channel MOSFET according to the second embodiment is shown on the left hand side of the figure. In the same manner as the MOSFET according to the first embodiment, the MOSFET according to the second embodiment includes an $n^{++}$-type drain layer 11, a first alternating conductivity type layer 12 in an active region 10, a second alternating conductivity type layer 22 in a breakdown withstanding region 20, and a heavily doped $n^+$-type intermediate drain layer 21. The first alternating conductivity type layer 12 is thinner than second alternating conductivity type layer 22. The $n^+$-type intermediate drain layer 21 is placed between first alternating conductivity type layer 12 and $n^{++}$-type drain layer 11.

The MOSFET according to the second embodiment is different from the MOSFET according to the first embodiment in that an n⁻-type very resistive region 23, whose specific resistance thereof is high, is placed around the second alternating conductivity type layer 22. As described below, the dimensions and the impurity concentrations of the constituent layers and regions in the MOSFET according to the second embodiment are almost the same as those of the MOSFET according to the first embodiment. The widths of n-type drift region 12a, p-type partition region 12b, n-type drift region 22a and p-type partition region 22b are the same 8.0 μm. In other words, the first pitch of repeating, with which a pair of n-type drift region 12a and p-type partition region 12b is repeated in active region 10, and the second pitch of repeating, with which a pair of n-type drift region 22a and p-type partition region 22b is repeated in breakdown withstanding region 20, are the same 16 μm. First alternating conductivity type layer 12 in active region 10 is 40 μm in thickness. Second alternating conductivity type layer 22 in breakdown withstanding region 20 is 50 μm in thickness. The impurity concentrations in n-type drift regions 12a, 22a and p-type partition regions 12b, 22b are the same $2.0\times10^{15}$ cm⁻³. The n⁺-type intermediate drain layer 21 is 10 μm in thickness. The impurity $5\times10^{17}$ cm⁻³. The impurity concentration in n⁺-type intermediate drain layer 21 is preferably between $1\times10^{14}$ cm⁻³ and $1\times10^{20}$ cm⁻.

The specific resistance of n⁻-type very resistive region 23 is preferably between 50 and 200 Ωcm. It should be noted that the very resistive region 23 may also be of p⁻-type depending on the application. The n⁻-type very resistive region 23 promotes depletion layer expansion in breakdown withstanding region 20 and facilitates relaxing the electric field in breakdown withstanding region 20. Therefore, the electric field strength in active region 10 reaches the critical value in advance to the electric field strength in breakdown withstanding region 20, and an avalanche current flows in the active region 10 of the MOSFET according to the second embodiment in the same manner as in the MOSFET according to the first embodiment. To stabilize the breakdown voltage, a peripheral electrode 27 may be disposed on a channel stopper region 25 outside n⁻-type very resistive region 23. Advantageously, the impurity concentration $N_D$ in the very resistive region and the breakdown voltage $V_{DSS}$ (V) of the semiconductor device are related to each other by the following expression.

$$N_D \leq 5.62\times10^{17}\times V_{DSS}^{-1.36}(\text{cm}^{-3})$$

Third Embodiment

Figure 3:
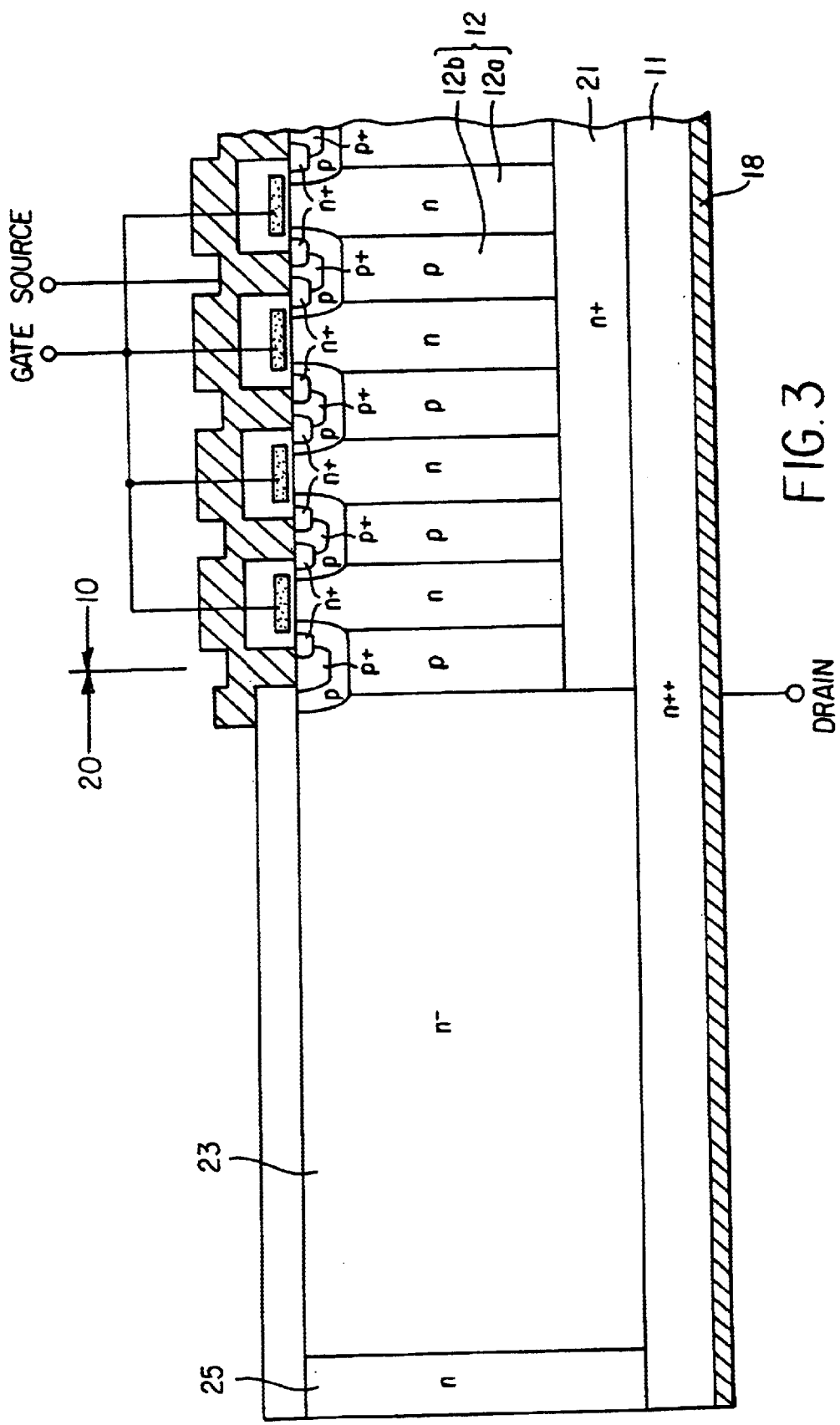
FIG. 3 is a cross sectional view, illustrating the peripheral portion of a vertical super-junction MOSFET according to a third embodiment of the invention.

FIG. 3 is a cross sectional view showing the peripheral portion of a vertical super-junction MOSFET according to a third embodiment of the invention. The edge portion of the n-channel MOSFET according to the third embodiment is shown on the left hand side of the figure. The MOSFET according to the third embodiment includes an n⁺⁺-type drain layer 11, a first alternating conductivity type layer 12 in an active region 10, and a heavily doped n⁺-type intermediate drain layer 21 between first alternating conductivity type layer 12 and n⁺⁺-type drain layer 11. The breakdown withstanding region 20 in the MOSFET according to the third embodiment does not include any second alternating conductivity type layer but includes an n⁻-type very resistive region 23, whose specific resistance is high, in a breakdown withstanding region 20. The n⁻-type very resistive region 23 is thicker than first alternating conductivity type layer 12. The very resistive region 23 may also be of p⁻-type.

The dimensions and the impurity concentrations of the constituent layers and regions in the MOSFET according to the third embodiment are almost the same as those of the MOSFET according to the first embodiment. In detail, the widths of n-type drift region 12a and p-type partition region 12b are the same 8.0 μm. In other words, the first pitch of repeating, with which a pair of n-type drift region 12a and p-type partition region 12b is repeated in active region 10 is 16 μm. First alternating conductivity type layer 12 in active region 10 is 40 μm in thickness. The n⁻-type very resistive region 23 in breakdown withstanding region 20 is 50 μm in thickness. The impurity concentrations in n-type drift regions 12a and p-type partition regions 12b are the same $2.0\times10^{15}$ cm⁻³. The n⁺-type intermediate drain layer 21 is 10 μm in thickness. The impurity concentration in n⁺-type intermediate drain layer 21 is $5\times10^{17}$ cm⁻³. The impurity concentration in n⁺-type intermediate drain layer 21 is preferably between $1\times10^{14}$ cm⁻³ and $1\times10^{20}$ cm⁻³.

The specific resistance of n⁻-type very resistive region 23 is preferably between 50 and 200 Ωcm. The very resistive region may also be of p⁻-type. The n⁻-type very resistive region 23 promotes depletion layer expansion in breakdown withstanding region 20 and facilitates relaxing the electric field in breakdown withstanding region 20. Therefore, the electric field strength in active region 10 reaches the critical value in advance of the electric field strength in breakdown withstanding region 20. When first alternating conductivity type layer 12 in active region 10 is thinner than n⁻-type very resistive region 23 in breakdown withstanding region 20, the electric field is denser in first alternating conductivity type layer 12 in active region 10 than in breakdown withstanding region 20. Thus, the electric field strength in active region 10 reaches the critical value in advance of the electric field strength in breakdown withstanding region 20, and, therefore, the breakdown voltage is determined by active region 10. Even when a high avalanche current flows, the avalanche current does not localize and, therefore, the breakdown withstanding capability is improved. Thus, the reliability of the super-junction semiconductor device is improved. Advantageously, the impurity concentration $N_D$ in the very resistive region and the breakdown voltage $V_{DSS}$ (V) of the semiconductor device are related to each other by the following expression.

$$N_D \leq 5.62\times10^{17}\times V_{DSS}^{-1.36}(\text{cm}^{-3})$$

Fourth Embodiment

Figure 4:
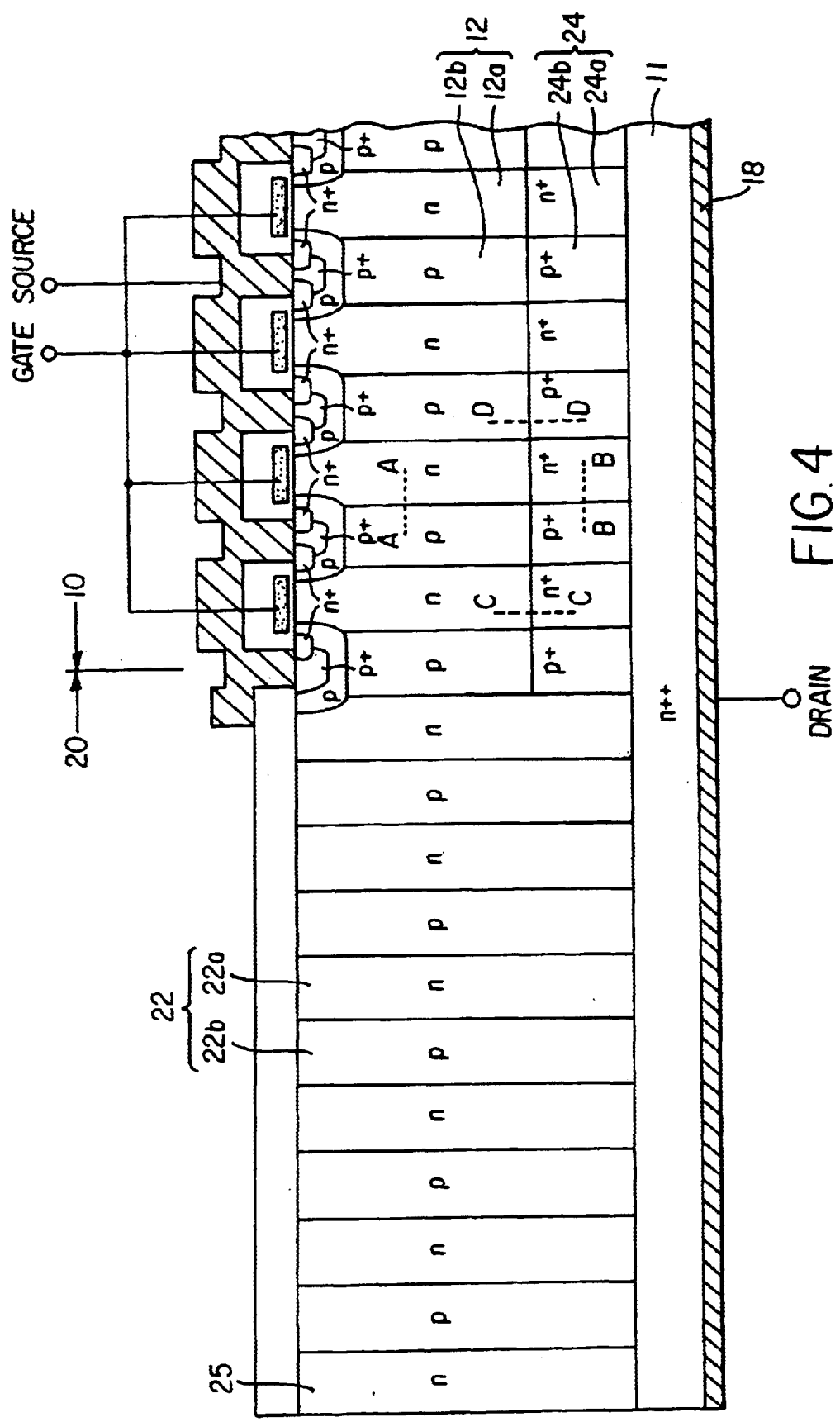
FIG. 4 is a cross sectional view, illustrating the peripheral portion of a vertical super-junction MOSFET according to a fourth embodiment of the invention.
Figure 5A:
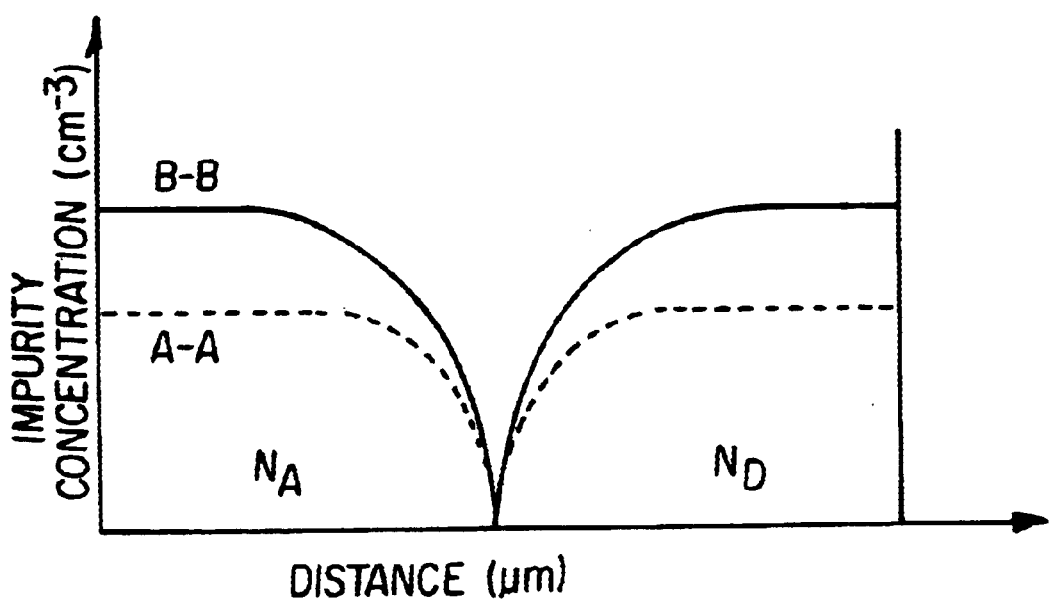
FIG. 5(a) illustrating the impurity distributions along A—A and B—B of FIG. 4.
Figure 5B:
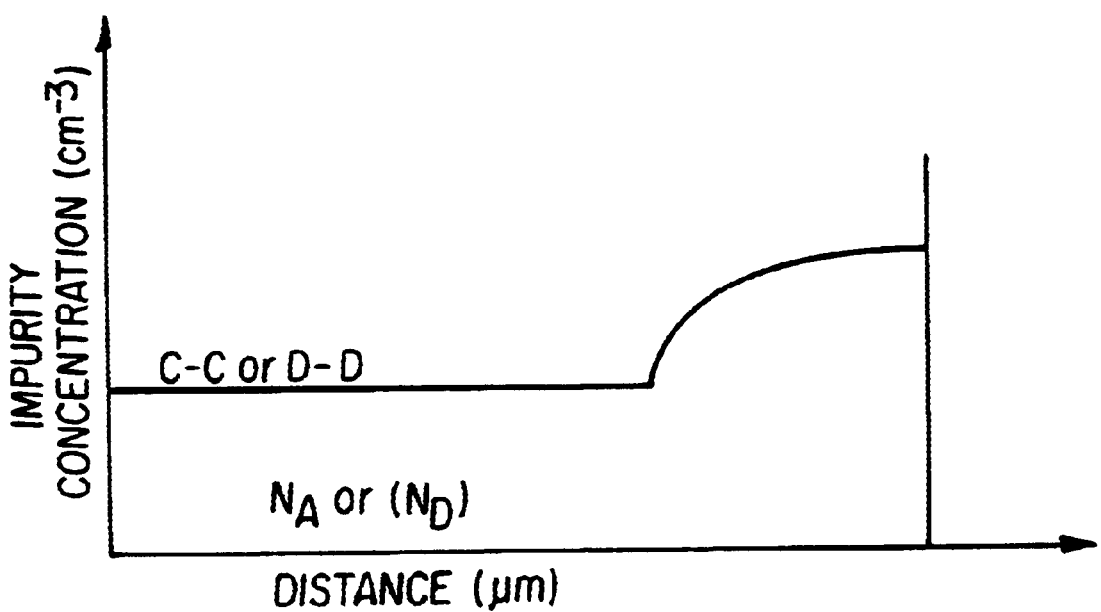
FIG. 5(b) illustrating the impurity distribution along C—C or D—D of FIG. 4.

FIG. 4 is a cross sectional view showing the peripheral portion of a vertical super-junction MOSFET according to a fourth embodiment of the invention. The edge portion of the n-channel MOSFET according to the fourth embodiment is shown on the left hand side of the figure. FIG. 5(a) shows impurity distribution profiles along A—A and B—B of FIG. 4. FIG. 5(b) shows an impurity distribution profile along C—C or D—D of FIG. 4. Referring now to FIG. 4, the MOSFET according to the fourth embodiment includes a first alternating conductivity type layer 12, a second alternating conductivity type layer 22, and a third alternating conductivity type layer 24 between first alternating conductivity type layer 12 and an n⁺⁺-type drain layer 11. According to the fourth embodiment, the total thickness of first alternating conductivity type layer 12 and third alternating conductivity type layer 24 is the same as the thickness of second alternating conductivity type layer 22 in the MOSFET. The impurity concentrations in third alternating conductivity type layer 24 in an active region 10 are changing in the thickness direction of third alternating conductivity type layer 24. The impurity concentrations in third alternating conductivity type layer 24 are increasing toward n⁺⁺-type drain layer 11. The heavily doped third alternating conductivity type layer 24 is formed of n$^+$-type fifth semiconductor regions (n$^+$-type drift regions) 24a and p$^+$-type sixth semiconductor regions (p$^+$-type partition regions) 24b.

Referring now to FIG. 5(a), the impurity concentrations (along B—B of FIG. 4) in third alternating conductivity type layer 24 are higher than the impurity concentrations (along A—A of FIG. 4) in the first alternating conductivity type layer 12. The n-type impurity concentration along C—C of FIG. 4 and the p-type impurity concentration along D—D of FIG. 4 clearly exhibit the distribution profiles as described above. The dimensions and the impurity concentrations of the constituent layers and regions in the MOSFET according to the fourth embodiment are almost the same as those in the MOSFET according to the first embodiment. In detail, the widths of n-type drift region 12a, p-type partition region 12b, n-type drift region 22a, p-type partition region 22b, n$^+$-type drift region 24a and p$^+$-type partition region 24b are the same 8.0 μm. In other words, the first pitch of repeating, with which a pair of n$^+$-type drift region 12a and p-type partition region 12b or a pair of n$^+$-type drift region 24a and p$^+$-type partition region 24b is repeated in active region 10, is 16 μm. The second pitch of repeating, with which a pair of n-type drift region 22a and p-type partition region 22b is repeated in breakdown withstanding region 20, is also 16 μm.

The total thickness of first alternating conductivity type layer 12 and third alternating conductivity type layer 24 in active region 10 is 50 μm. Second alternating conductivity type layer 22 in breakdown withstanding region 20 is 50 μm in thickness. The impurity concentrations in n-type drift regions 12a, 22a and p-type partition regions 12b, 22b are the same 2.0×10$^{15}$ cm$^{-3}$. Third alternating conductivity type layer 24 in active region 10 is 10 μm in thickness. The impurity concentrations in n$^+$-type drift regions 24a and p$^+$-type partition regions 24b are the same 6.0×10$^{15}$ cm$^{-3}$. To surely generate an avalanche current in the bottom portion of active region 10 in advance, the impurity concentrations in heavily doped third alternating conductivity type layer 24 are preferably between 3×10$^{15}$ cm$^{-3}$ and 1×10$^{16}$ cm$^{-3}$.

Due to heavily doped alternating conductivity type layer 24 beneath first alternating conductivity type layer 12 in active region 10, depletion layers hardly expand in the bottom portion of active region 10 and the electric field strength in the bottom portion of active region 10 is higher than the electric field strength in breakdown withstanding region 20. Therefore, the electric field strength in active region 10 reaches the critical value in advance of the electric field strength in breakdown withstanding region 20.

Since the electric field strength is high, especially in the thickness direction of the semiconductor chip, in the vicinity of heavily doped p$^+$-type partition regions 24b and n$^{++}$-type drain layer 11, an avalanche current is caused in the bottom portion of active region 10. Since the avalanche current does not localize even when the avalanche current is high, the parasitic transistor hardly works, the avalanche withstanding capability under an L-load is improved and a very reliable semiconductor device is obtained.

Preferably, the impurity concentrations in p$^+$-type partition regions 24b and n$^+$-type drift regions 24a along B—B of FIG. 4 are the same as shown in FIG. 5(a). For the MOSFET of the 600 V class, the impurity concentration difference is preferably less than 5% to confine the breakdown voltage lowering caused by the high impurity concentrations within its tolerable range. If the impurity concentration in p$^+$-type partition regions 24b of in n$^+$-type drift regions 24a along B—B of FIG. 4 is higher than the impurity concentration in n$^+$-type drift regions 24a or in p$^+$-type partition regions 24b, imbalance will be caused between the charges in p$^+$-type partition regions 24b and n$^+$-type drift regions 24a. The charge imbalance further causes a dense electric field in heavily doped third alternating conductivity type layer 24, and the electric field strength in active region 10 reaches the critical value in advance of the electric field strength in breakdown withstanding region 20.

When the impurity concentration in p$^+$-type partition regions 24b is higher than in n$^+$-type drift regions 24a or vice versa, the electric field strength in the bottom portion of active region 10 first reaches the critical value in the same manner as in the case, therein the impurity concentrations in p$^+$-type partition regions 24b and in n$^+$-type drift regions 24a are the same. Therefore, it is necessary for the impurity concentration in p$^+$-type partition regions 24b or in n$^+$-type drift regions 24a to be higher than the impurity concentrations along A—A of FIG. 4 in first alternating conductivity type layer 12.

Alternatively, the second pitch of repeating, with which a pair of n-type drift region 22a and p-type partition region 22b is repeated in second alternating conductivity type layer 22, may be shorter than the first pitch of repeating, with which a pair of n-type drift region 12a and p-type partition region 12b is repeated in first alternating conductivity type layer 12. Since this alternative structure facilitates generating more depletion layers per a unit length in breakdown withstanding region 20 than in active region 10, the electric field is relaxed more in breakdown withstanding region 20 than in active region 10. Therefore, the alternative structure facilitates determining the breakdown voltage by active region 10 in the same way as the basic structure shown in FIG. 4.

Alternatively, the boundaries between n-type drift regions 22a and p-type partition regions 22b may be extended in perpendicular to the boundaries between n-type drift regions 12a and p-type partition regions 12b. In this alternative structure, the second pitch of repeating, with which a pair of n-type drift region 22a and p-type partition region 22b is repeated in second alternating conductivity type layer 22, may be shorter than the first pitch of repeating, with which a pair of n-type drift region 12a and p-type partition region 12b is repeated in first alternating conductivity type layer 12. These modifications are also effective to determine the breakdown voltage by active region 10 in the same way as the basic structure shown in FIG. 4.

Fifth Embodiment

Figure 6:
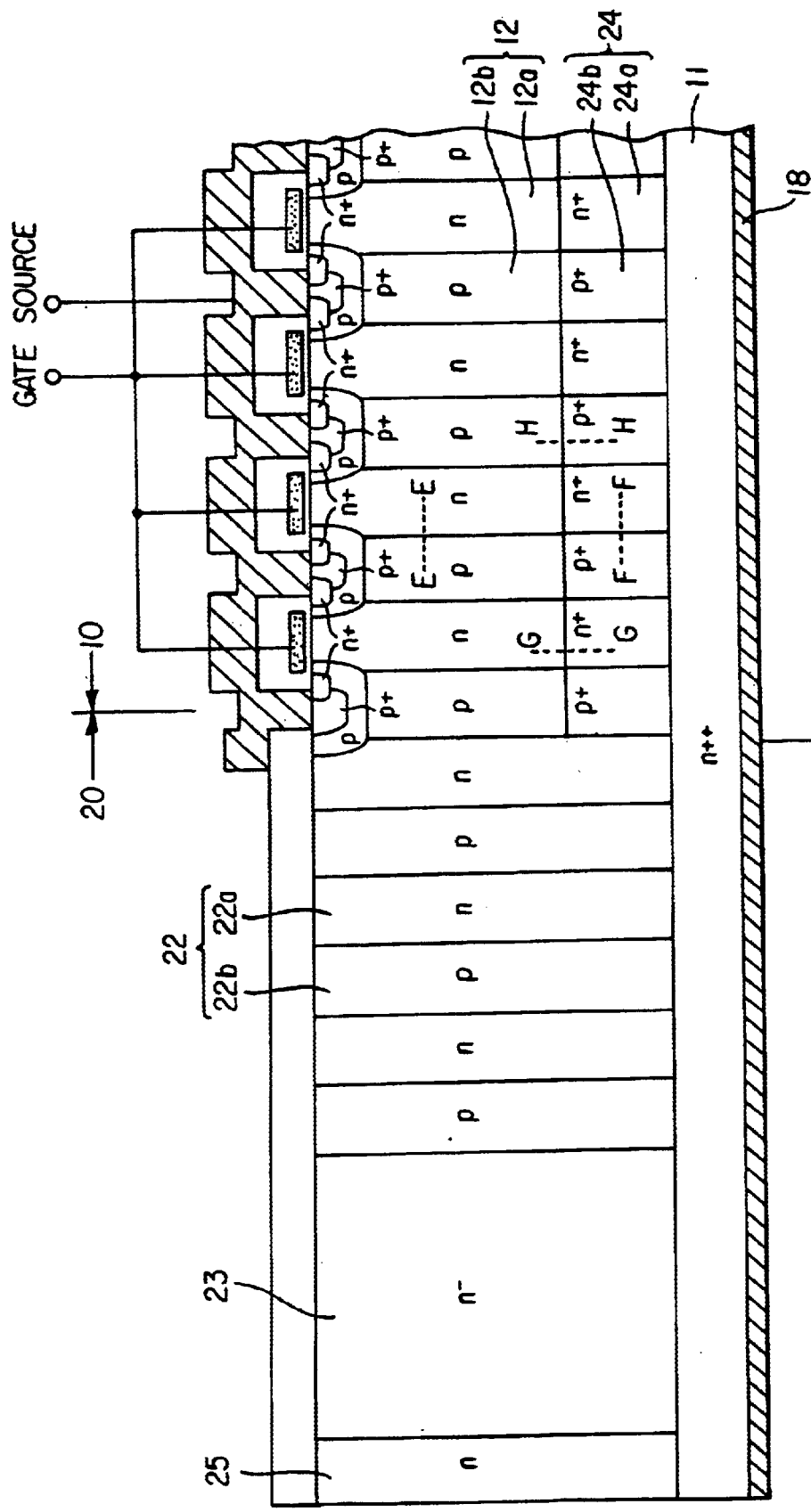
FIG. 6 is a cross sectional view, illustrating the peripheral portion of a vertical super-junction MOSFET according to a fifth embodiment of the invention.

FIG. 6 is a cross sectional view showing the peripheral portion of a vertical super-junction MOSFET according to a fifth embodiment of the invention. The edge portion of the n-channel MOSFET according to the fifth embodiment is shown on the left hand side of the figure. The impurity concentration distribution along E—E of FIG. 6 is similar to the impurity concentration distribution along A—A of FIG. 4. The impurity concentration distribution along F—F of FIG. 6 is similar to the impurity concentration distribution along B—B of FIG. 4. The impurity concentration distribution along G—G of FIG. 6 is similar to the impurity concentration distribution along C—C of FIG. 4. The impurity concentration distribution along H—H of FIG. 6 is similar to the impurity concentration distribution along D—D of FIG. 4.

In the same manner as the MOSFET according to the fourth embodiment, the MOSFET according to the fifth embodiment includes a first alternating conductivity type layer 12, a second alternating conductivity type layer 22, and a third alternating conductivity type layer 24 between first alternating conductivity type layer 12 and an n$^{++}$-type drain layer 11. The total thickness of the first alternating conductivity type layer 12 and the third alternating conductivity type layer 24 is the same as the thickness of the second alternating conductivity type layer 22. The impurity concentrations in third alternating conductivity type layer 24 in an active region 10 are higher than those in first alternating conductivity type layer 12. The heavily doped third alternating conductivity type layer 24 is formed of n$^+$-type drift regions 24a and p$^+$-type partition regions 24b. The MOSFET according to the fifth embodiment is different from the MOSFET according to the fourth embodiment in that the MOSFET according to the fifth embodiment further includes a very resistive region 23, whose specific resistance is high, around second alternating conductivity type layer 22.

Typical dimensions and impurity concentrations of the constituent layers and regions are almost same as those in the MOSFET according to the fourth embodiment. In detail, the total thickness of first alternating conductivity type layer 12 and third alternating conductivity type layer 24 in active region 10 is 50 μm. The second alternating conductivity type layer 22 in breakdown withstanding region 20 is 50 μm in thickness. The impurity concentrations in n-type drift regions 12a, 22a and p-type partition regions 12b, 22b are the same $2.0 \times 10^{15}$ cm$^{-3}$. The third alternating conductivity type layer 24 in active region 10 is 10 μm in thickness. The impurity concentrations in n$^+$-type drift regions 24a and p$^+$-type partition regions 24b are the same $6.0 \times 10^{15}$ cm$^{-3}$. To surely generate an avalanche current in the bottom portion of active region 10 in advance, the impurity concentrations in heavily doped alternating conductivity type layer 24 are preferably between $3 \times 10^{15}$ cm$^{-3}$ and $1 \times 10^{16}$ cm$^{-3}$. The specific resistance of n$^-$-type very resistive region 23 is preferably between 50 and 200 Ωcm. The very resistive region 23 may also be of p$^-$-type.

The n$^-$-type very resistive region 23 promotes depletion layer expansion in breakdown withstanding region 20 and facilitates relaxing the electric field in breakdown withstanding region 20. Therefore, the electric field strength in active region 10 reaches the critical value in advance of the electric field strength in breakdown withstanding region 20, and an avalanche current flows in the active region 10. Thus, the semiconductor structure according to the fifth embodiment facilitates improving the avalanche withstanding capability and the reliability of the semiconductor device. Advantageously, the impurity concentration $N_D$ in the very resistive region and the breakdown voltage $V_{DSS}$ (V) of the semiconductor device are related to each other by the following expression.

$$N_D \leq 5.62 \times 10^{17} \times V_{DSS}^{-1.36} (\text{cm}^{-3})$$

Alternatively, alternating conductivity type layer 22 in breakdown withstanding region 20 may be doped more lightly. Alternatively, the boundaries between n-type drift regions 22a and p-type partition regions 22b may be extended perpendicular to the boundaries between the n-type drift regions and the p-type partition regions in active region 10. These modifications are also effective in improving the avalanche withstanding capability and the reliability of the semiconductor device.

Sixth Embodiment

Figure 7:
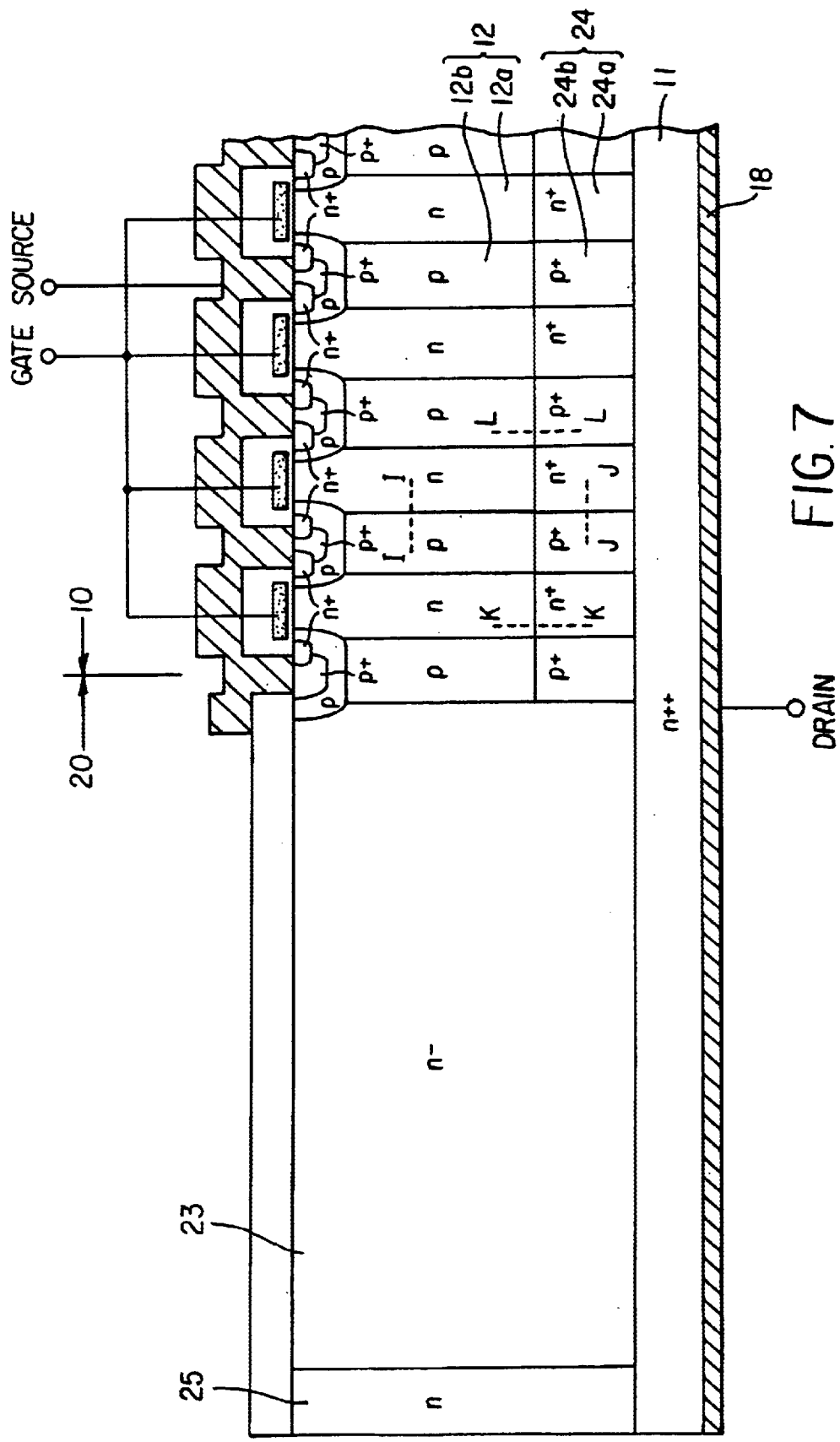
FIG. 7 is a cross sectional view, illustrating the peripheral portion of a vertical super-junction MOSFET according to a sixth embodiment of the invention.
Figure 8:
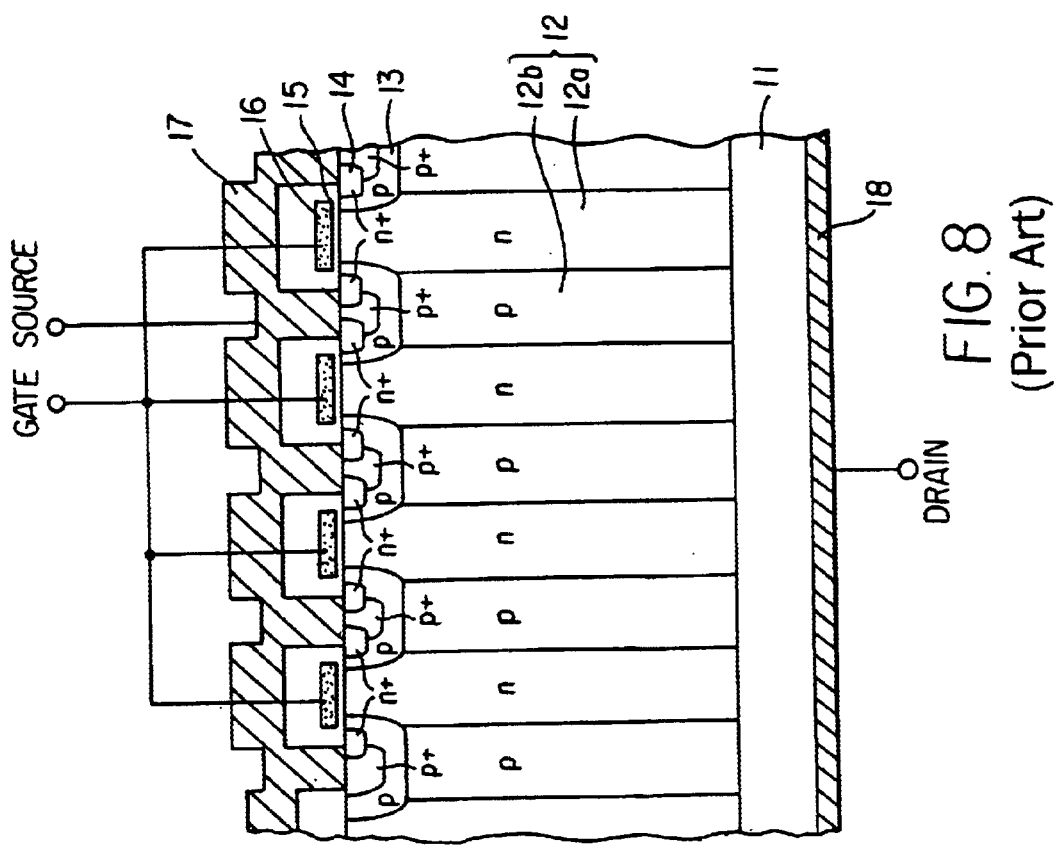
FIG. 8 is a cross sectional view of the vertical MOSFET disclosed in U.S. Pat. No. 5,216,275.

FIG. 7 is a cross sectional view showing the peripheral portion of a vertical super-junction MOSFET according to a sixth embodiment of the invention. The edge portion of the MOSFET according to the sixth embodiment is shown on the left hand side of the figure. The impurity concentration distribution along I—I of FIG. 7 is similar to the impurity concentration distribution along A—A of FIG. 4. The impurity concentration distribution along J—J of FIG. 7 is similar to the impurity concentration distribution along B—B of FIG. 4. The impurity concentration distribution along K—K of FIG. 7 is similar to the impurity concentration distribution along C—C of FIG. 4. The impurity concentration distribution along L—L of FIG. 7 is similar to the impurity concentration distribution along D—D of FIG. 4.

Referring now to FIG. 7, the MOSFET according to the sixth embodiment includes an active region 10 including a first alternating conductivity type layer 12 and a third alternating conductivity type layer 24 between first alternating conductivity type layer 12 and an n$^{++}$-type drain layer 11. Third alternating conductivity type layer 24 is doped more heavily than first alternating conductivity type layer 12. The heavily doped third alternating conductivity type layer 24 is formed of n$^+$-type drift regions 24a and p$^+$-type partition regions 24b. The MOSFET according to the sixth embodiment includes a breakdown withstanding region 20 including a very resistive region 23, whose specific resistance is high, and a channel stopper region 25 around very resistive region 23. The MOSFET according to the sixth embodiment does not include any alternating conductivity type layer in breakdown withstanding region 20. The total thickness of first and third alternating conductivity type layers 12 and 24, and the thickness of very resistive region 23 are the same.

Typical dimensions and impurity concentrations of the constituent layers and regions are almost same as those in the MOSFET according to the fourth embodiment. In detail, the width of n-type drift region 12a, the width of p-type partition region 12b, the width of n$^+$-type region 24a and the width of p$^+$-type region 24b are the same 8 μm. In other words, the first pitch of repeating, with which a pair of n-type drift region 12a and p-type partition region 12b, or a pair of n$^+$-type drift region 24a and p$^+$-type partition region 24b is repeated, is 16 μm. The total thickness of first alternating conductivity type layer 12 and third alternating conductivity type layer 24 in active region 10 is 50 μm. Very resistive region 23 in breakdown withstanding region 20 is 50 μm in thickness. The impurity concentrations in n-type drift region 12a and p-type partition region 12b are the same $2.0 \times 10^{15}$ cm$^{-3}$.

Third alternating conductivity type layer 24 in active region 10 is 10 μm in thickness. The impurity concentrations in n$^+$-type drift regions 24a and p$^+$-type partition regions 24b are the same $6.0 \times 10^{15}$ cm$^{-3}$. To surely generate an avalanche current in the bottom portion of active region 10 in advance, the impurity concentrations in heavily doped alternating conductivity type layer 24 are preferably between $3 \times 10^{15}$ cm$^{-3}$ and $1 \times 10^{16}$ cm$^{-3}$. The specific resistance of n$^+$-type very resistive region 23 is preferably between 50 and 200 Ωcm. The very resistive region may also be of p$^-$-type.

Due to heavily doped alternating conductivity type layer 24 beneath first alternating conductivity type layer 12, depletion layers hardly expand in the bottom portion of active region 10. Moreover, n$^-$-type very resistive region 23 constituting breakdown withstanding region 20 promotes depletion layer expansion in breakdown withstanding region 20 and facilitates relaxing the electric field in breakdown withstanding region 20. The electric field strength in the bottom portion of active region 10 is higher than the electric field strength in breakdown withstanding region 20. The electric field strength in the bottom portion of active region 10 reaches the critical value in advance of the electric field strength in breakdown withstanding region 20. Therefore, the breakdown voltage is determined by active region 10. Since the electric field strength is high, especially in the thickness direction of the semiconductor chip, in the vicinity of heavily doped p⁺-type partition regions 24b and n⁺⁺-type drain layer 11, an avalanche current is caused in the bottom portion of active region 10. Since the avalanche current does not localize even when the avalanche current is high, the parasitic transistor hardly works, the avalanche withstanding capability under an L-load is improved and a very reliable semiconductor device is obtained.

Either the n-type drift regions 24a or the p-type partition regions 24b of third alternating conductivity type layer 24 in the bottom portion of active region 10 may be doped more heavily than the other layer to generate an avalanche current in the bottom portion of the active region. Due to the charge imbalance caused in third alternating conductivity type layer 24, the breakdown voltage is determined by the active region. Thus, avalanche current localization is prevented from occurring, and a very reliable super-junction semiconductor device is obtained. For stabilizing the breakdown voltage, it is preferable to dispose a peripheral electrode as a channel stopper on very resistive n-type region 23. Advantageously, the impurity concentration $N_D$ in the very resistive region and the breakdown voltage $V_{DSS}$ (V) of the semiconductor device are related to each other by the following expression.

$$N_D \leq 5.62 \times 10^{17} \times V_{DSS}^{-1.36} (\text{cm}^{-3})$$

As explained above, the super-junction semiconductor device according to the invention, including a first major surface, a second major surface, a first main electrode on the first major surface, a second main electrode on the second major surface, a layer with low electrical resistance on the side of the second major surface, a thin first alternating conductivity type layer between the layer with low electrical resistance and the first major surface, and a thick second alternating conductivity type layer around the thin first alternating conductivity type layer, facilitates generating an avalanche current in the active region and improving the avalanche withstanding capability under an L-load. Since the first alternating conductivity type layer in the active region is thin, the drift current path is shortened and, therefore, the on-resistance is reduced.

By doping the predetermined bottom portion of the active region (the intermediate drift layer or the third alternating conductivity type layer) more heavily than the second alternating conductivity type layer in the breakdown withstanding region, an avalanche current is generated surely in the active region in advance, and the avalanche withstanding capability under an L-load is improved. Due to many carriers in the more heavily doped predetermined bottom portion of the active region, the on-resistance is reduced. Having a very resistive region, the specific resistance of which is high, in the breakdown withstanding region facilitates relaxing the electric field in the breakdown withstanding region, generating an avalanche current surely in the active region in advance and improving the avalanche withstanding capability under an L-load.

Thus, the invention is effectively applied to further improve the reliability and the characteristics of the super-junction semiconductor devices that have relaxed the tradeoff relation between the on-resistance and the breakdown voltage thereof.

What is claimed is:

1. A semiconductor device comprising:
    a semiconductor chip having a first major surface and a second major surface facing opposite to the first major surface;
    a first main electrode on the first major surface;
    a layer with low electrical resistance formed in the semiconductor chip adjacent to the second major surface;
    a second main electrode located on the second major surface over the layer with low electrical resistance;
    a first alternating conductivity type layer comprising first semiconductor regions of a first conductivity type and second semiconductor regions of a second conductivity type arranged alternately at a first pitch;
    a second alternating conductivity type layer comprising third semiconductor regions of the first conductivity type and fourth semiconductor regions of the second conductivity type arranged alternately at a second pitch;
    wherein the first alternating conductivity type layer and the second alternating conductivity type layer are located between the first major surface and the layer with low electrical resistance; and
    wherein the thickness of the first alternating conductivity type layer and the thickness of the second alternating conductivity type layer are different from each other.

2. The semiconductor device according to claim 1, wherein the second alternating conductivity type layer is thicker than the first alternating conductivity type layer, and the second alternating conductivity type layer is located around the first alternating conductivity type layer.

3. The semiconductor device according to claim 2, wherein the second pitch is narrower than the first pitch.

4. The semiconductor device according to claim 2, wherein the impurity concentrations in the second alternating conductivity type layer are lower than the impurity concentrations in the first alternating conductivity type layer.

5. The semiconductor device according to claim 2, further comprising an intermediate semiconductor layer of the first conductivity type between the first alternating conductivity type layer and the layer with low electrical resistance.

6. The semiconductor device according to claim 5, wherein the impurity concentration in the intermediate semiconductor layer is higher than the impurity concentration in the first semiconductor regions in the first alternating conductivity type layer.

7. The semiconductor device according to claim 2, further comprising a channel stopper region around the second alternating conductivity type layer, the channel stopper region being on the layer with low electrical resistance.

8. The semiconductor device according to claim 2, further comprising a very resistive region, the specific resistance thereof is high, of the first conductivity type or the second conductivity type around the second alternating conductivity type layer.

9. A semiconductor device comprising:
    a semiconductor chip having a first major surface and a second major surface facing opposite to the first major surface;
    a first main electrode on the first major surface;
    a layer with low electrical resistance formed in the semiconductor chip adjacent to the second major surface;
    a second main electrode located on the second major surface over the layer with low electrical resistance
    a first alternating conductivity type layer between the first major surface and the layer with low electrical resistance, the first alternating conductivity type layer comprising first semiconductor regions of a first conductivity type and second semiconductor regions of a second conductivity type arranged alternately; and a very resistive region, the specific resistance thereof is high, of the first conductivity type or the second conductivity type around the first alternating conductivity type layer, the very resistive region being thicker than the first alternating conductivity type layer.

10. The semiconductor device according to claim 9, further comprising an intermediate semiconductor layer of the first conductivity type between the alternating conductivity type layer and the layer with low electrical resistance.

11. The semiconductor device according to claim 10, wherein the impurity concentration in the intermediate semiconductor layer is higher than the impurity concentration in the first semiconductor region in the alternating conductivity type layer.

12. The semiconductor device according to claim 8, wherein the impurity concentration $N_D$ in the very resistive region and the breakdown voltage $V_{DSS}$ (V) of the semiconductor device are related to each other by the following expression $$N_D \leq 5.62 \times 10^{17} \times V_{DSS}^{-1.36} (\text{cm}^{-3}).$$

13. The semiconductor device according to claim 9, wherein the impurity concentration $N_D$ in the very resistive region and the breakdown voltage $V_{DSS}$ (V) of the semiconductor device are related to each other by the following expression $$N_D \leq 5.62 \times 10^{17} \times V_{DSS}^{-1.36} (\text{cm}^{-3}).$$

14. The semiconductor device according to claim 8, further comprising a channel stopper region around the very resistive region.

15. The semiconductor device according to claim 9, further comprising a channel stopper region around the very resistive region.

16. A semiconductor device comprising:
a semiconductor chip having a first major surface and a second major surface facing opposite to the first major surface;
a first main electrode on the first major surface;
a layer with low electrical resistance formed in the semiconductor chip adjacent to the second major surface;
a second main electrode located on the second major surface over the layer with low electrical resistance;
a first alternating conductivity type layer between the first major surface and the layer with low electrical resistance, the first alternating conductivity type layer comprising first semiconductor regions of a first conductivity type and second semiconductor regions of a second conductivity type arranged alternately at a first pitch of repeating; and
a third alternating conductivity type layer between the first alternating conductivity type layer and the layer with low electrical resistance, the third alternating conductivity type layer comprising fifth semiconductor regions of the first conductivity type and sixth semiconductor regions of the second conductivity type arranged alternately at the first pitch, the impurity concentrations in the fifth semiconductor regions and the sixth semiconductor regions and the impurity concentrations in the first semiconductor regions and the second semiconductor regions being different from each other.

17. The semiconductor device according to claim 16, wherein the impurity concentrations in the fifth semiconductor regions and the sixth semiconductor regions are higher than the impurity concentrations in the first semiconductor regions and the second semiconductor regions.

18. The semiconductor device according to claim 16, wherein the impurity concentration in the fifth semiconductor regions or the impurity concentration in the sixth semiconductor regions is higher than the impurity concentration in the first semiconductor regions or the impurity concentration in the second semiconductor regions.

19. The semiconductor device according to claim 17, further comprising a second alternating conductivity type layer around the first alternating conductivity type layer and the third alternating conductivity type layer, the second alternating conductivity type layer comprising third semiconductor regions of the first conductivity type and fourth semiconductor regions of the second conductivity type arranged alternately at a second pitch.

20. The semiconductor device according to claim 18, further comprising a second alternating conductivity type layer around the first alternating conductivity type layer and the third alternating conductivity type layer, the second alternating conductivity type layer comprising third semiconductor regions of the first conductivity type and fourth semiconductor regions of the second conductivity type arranged alternately at a second pitch.

21. The semiconductor device according to claim 19, wherein the second pitch is narrower than the first pitch.

22. The semiconductor device according to claim 20, wherein the second pitch is narrower than the first pitch.

23. The semiconductor device according to claim 19, wherein the impurity concentrations in the second alternating conductivity type layer are lower than the impurity concentrations in the third alternating conductivity type layer.

24. The semiconductor device according to claim 20, wherein the impurity concentrations in the second alternating conductivity type layer are lower than the impurity concentrations in the third alternating conductivity type layer.

25. The semiconductor device according to claim 19, further comprising a channel stopper region around the second alternating conductivity type layer, the channel stopper region being on the layer with low electrical resistance.

26. The semiconductor device according to claim 20, further comprising a channel stopper region around the second alternating conductivity type layer, the channel stopper region being on the layer with low electrical resistance.

27. The semiconductor device according to claim 16, further comprising a very resistive region, the specific resistance thereof is high, of the first conductivity type or the second conductivity type around the first alternating conductivity type layer and the third alternating conductivity type layer.

28. The semiconductor device according to claim 19, further comprising a very resistive region, the specific resistance thereof is high, of the first conductivity type or the second conductivity type around the second alternating conductivity type layer.

29. The semiconductor device according to claim 20, further comprising a very resistive region, the specific resistance thereof is high, of the first conductivity type or the second conductivity type around the second alternating conductivity type layer.

30. The semiconductor device according to claim 27, wherein the impurity concentration $N_D$ in the very resistive region and the breakdown voltage $V_{DSS}$ (V) of the semiconductor device are related to each other by the following expression $$N_D \leq 5.62 \times 10^{17} \times V_{DSS}^{-1.36} (cm^{-3}).$$

31. The semiconductor device according to claim 28, wherein the impurity concentration $N_D$ in the very resistive region and the breakdown voltage $V_{DSS}$ (V) of the semiconductor device are related to each other by the following expression $$N_D \leq 5.62 \times 10^{17} \times V_{DSS}^{-1.36} (cm^{-3}).$$

32. The semiconductor device according to claim 29, wherein the impurity concentration $N_D$ in the very resistive region and the breakdown voltage $V_{DSS}$ (V) of the semiconductor device are related to each other by the following expression $$N_D \leq 5.62 \times 10^{17} \times V_{DSS}^{-1.36} (cm^{-3}).$$

33. The semiconductor device according to claim 27, further comprising a channel stopper region around the very resistive region.

34. The semiconductor device according to claim 28, further comprising a channel stopper region around the very resistive region.

35. The semiconductor device according to claim 29, further comprising a channel stopper region around the very resistive region.

* * * * *